(12) United States Patent
Tsai et al.

(10) Patent No.: US 10,187,024 B2
(45) Date of Patent: Jan. 22, 2019

(54) INPUT FEED-FORWARD TECHNIQUE FOR CLASS AB AMPLIFIER

(71) Applicant: MEDIATEK INC., Hsin-Chu (TW)

(72) Inventors: Hung-Chieh Tsai, Kaohsiung (TW); Yu-Hsin Lin, Taipei (TW)

(73) Assignee: MEDIATEK INC., Hsin-Chu (TW)

( * ) Notice: Subject to any disclaimer, the term of this patent is extended or adjusted under 35 U.S.C. 154(b) by 26 days.

(21) Appl. No.: 15/488,533

(22) Filed: Apr. 17, 2017

(65) Prior Publication Data

US 2017/0324387 A1 Nov. 9, 2017

Related U.S. Application Data

(60) Provisional application No. 62/333,326, filed on May 9, 2016.

(51) Int. Cl.
*H03F 3/45* (2006.01)
*H03F 1/02* (2006.01)

(52) U.S. Cl.
CPC ....... *H03F 3/45695* (2013.01); *H03F 1/0222* (2013.01); *H03F 3/45179* (2013.01); *H03F 2203/45024* (2013.01); *H03F 2203/45462* (2013.01); *H03F 2203/45504* (2013.01)

(58) Field of Classification Search
CPC ........................................................ H03F 3/45
USPC ........................................................ 330/253
See application file for complete search history.

(56) References Cited

U.S. PATENT DOCUMENTS

| 5,604,464 | A | 2/1997 | Hwang |
| 6,278,321 | B1 | 8/2001 | Franck |
| 6,870,424 | B2 | 3/2005 | Pradhan |
| 7,683,720 | B1 | 3/2010 | Yehui |
| 8,890,611 | B2 | 11/2014 | Tsai |
| 2008/0238546 | A1 | 10/2008 | Kim |
| 2008/0303595 | A1 | 12/2008 | Lee |
| 2009/0231039 | A1 | 9/2009 | Yuasa |

FOREIGN PATENT DOCUMENTS

EP 2 709 273 A1 3/2014

OTHER PUBLICATIONS

Ron Hogervorst, A Compact Power-Efficient 3 V CMOS Rail-to-Rail Input/Output Operational Amplifier for VLSI Cell Libraries, IEEE Journal of Solid-State Circuits, vol. 29, No. 12, Dec. 1994.

*Primary Examiner* — Patricia T Nguyen
(74) *Attorney, Agent, or Firm* — Winston Hsu

(57) ABSTRACT

An amplifier includes an amplifying stage, a cascoded circuit, an input feed-forward circuit and an output stage. The amplifying stage is arranged receiving a differential input pair to generate an amplified differential input pair. The input feed-forward circuit is coupled to the cascoded circuit, and is arranged for feeding the differential input pair forward to the cascoded circuit. The output stage is coupled to the amplifying stage and the cascoded circuit, and is arranged for generating a differential output pair according to the amplified differential input pair and an output of the cascoded circuit.

20 Claims, 4 Drawing Sheets

INPUT FEED-FORWARD TECHNIQUE FOR CLASS AB AMPLIFIER

CROSS REFERENCE TO RELATED APPLICATIONS

This application claims the priority of U.S. Provisional Application No. 62/333,326, filed on May 9, 2016, which is included herein by reference in its entirety.

BACKGROUND

A class AB amplifier is generally used in a system requiring high power and high efficiency. However, when the class AB amplifier is applied to a wide-band application (e.g. the bandwidth is greater than 300 MHz), the amplifier may become unstable due to the parasitic poles from pads. Therefore, the design of the class AB amplifier becomes difficult and power hungry.

SUMMARY

It is therefore an objective of the present invention to provide an amplifier, which provides an input feed-forward path to a cascoded circuit and avoids a positive feedback in a common mode loop, to stabilize the amplifier.

According to one embodiment of the present invention, an amplifier includes an amplifying stage, a cascoded circuit, an input feed-forward circuit and an output stage. The amplifying stage is arranged receiving a differential input pair to generate an amplified differential input pair. The input feed-forward circuit is coupled to the cascoded circuit, and is arranged for feeding the differential input pair forward to the cascoded circuit. The output stage is coupled to the amplifying stage and the cascoded circuit, and is arranged for generating a differential output pair according to the amplified differential input pair and an output of the cascoded circuit.

According to another embodiment of the present invention, a class AB amplifier comprises an amplifying stage, a cascoded circuit, an input feed-forward circuit and an output stage. The amplifying stage is arranged receiving a differential input pair to generate an amplified differential input pair. The input feed-forward circuit is coupled to the cascoded circuit, and is arranged for feeding the differential input pair forward to the cascoded circuit. The output stage is coupled to the amplifying stage and the cascoded circuit, and is arranged for generating a differential output pair according to the amplified differential input pair and an output of the cascoded circuit.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
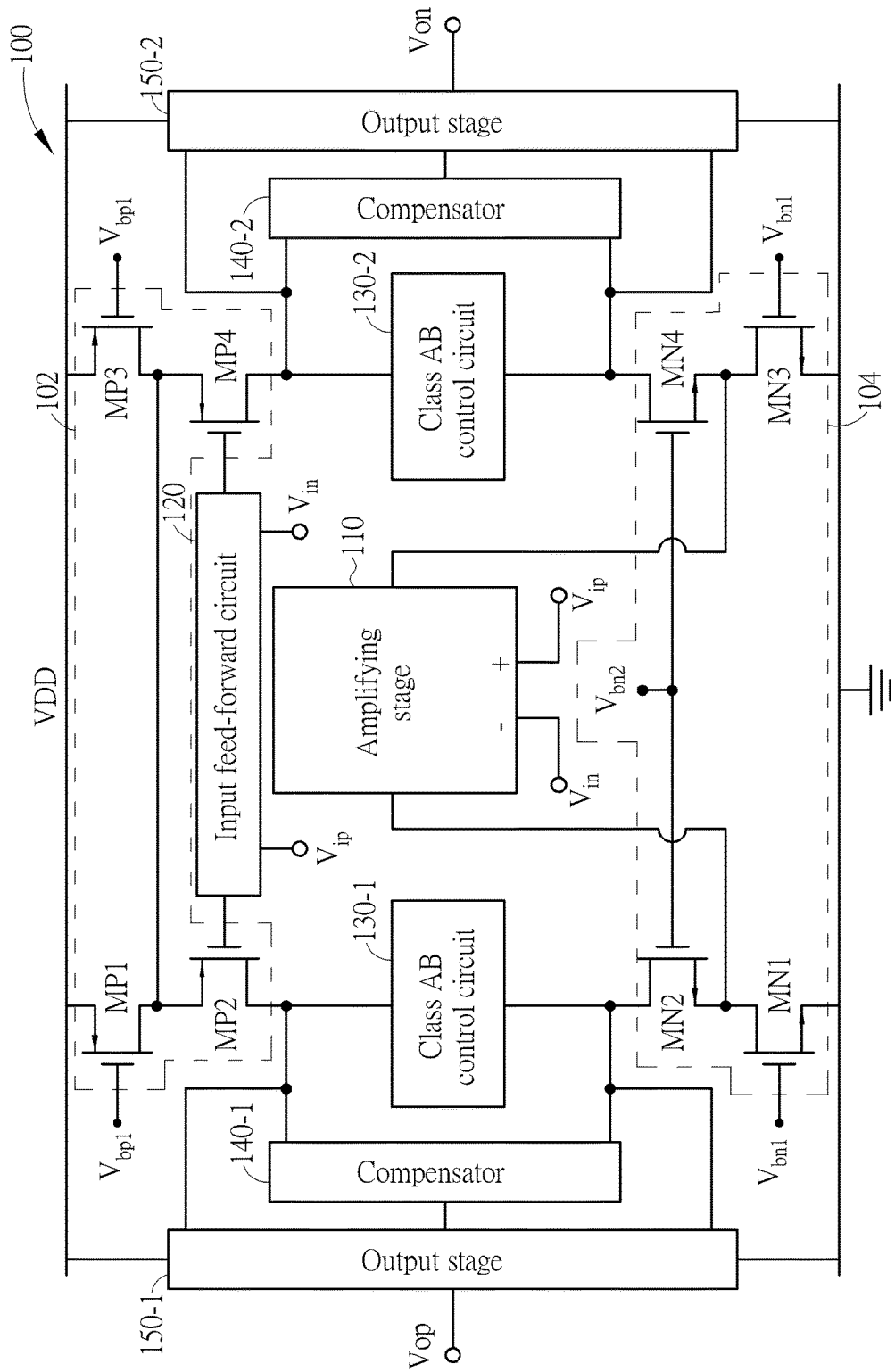
FIG. 1 is a diagram illustrating an amplifier according to one embodiment of the present invention.

Please refer to FIG. 1, which is a diagram illustrating an amplifier 100 according to one embodiment of the present invention, where in this embodiment, the amplifier 100 is a class AB amplifier. As shown in FIG. 1, the amplifier 100 supplied by a supply voltage VDD comprises a first cascoded circuit 102, a second cascoded circuit 104, an amplifying stage 110, an input feed-forward circuit 120, class AB control circuits 130_1 and 130_2, compensators 140_1 and 140_2, and output stages 150_1 and 150_2.

In this embodiment, the first cascoded circuit 102 comprises four PMOSs MP1-MP4, where the PMOSs MP1 and MP2 are connected in cascode, the PMOSs MP3 and MP4 are connected in cascode, each of the PMOSs MP1 and MP3 are biased by a bias voltage $V_{bp1}$ to be a current source, and a source electrode the PMOS MP2 is directly connected to a source electrode of the PMOS MP4; the second cascoded circuit 104 comprises four NMOSs MN1-MN4, where the NMOSs MN1 and MN2 are connected in cascode, the NMOSs MN3 and MN4 are connected in cascode, each of the NMOSs MN1 and MN3 are biased by a bias voltage $V_{bn1}$ to be a current source, and each of the NMOSs MN2 and MN4 are biased by a bias voltage $V_{bn2}$. The amplifying stage 110 can be any suitable differential amplifying stage such as a cascode differential amplifier. The input feed-forward circuit 120 is coupled to gate electrodes of the PMOSs MP2 and MP4, and the input feed-forward circuit 120 is arranged to feed a differential pair of input signals Vip and Vin forward to the PMOSs MP2 and MP4, respectively. The class AB control circuit 130_1 is coupled between the PMOS MP2 and the NMOS MN2, the class AB control circuit 130_2 is coupled between the PMOS MP4 and the NMOS MN4, and the class AB control circuits 130_1 and 130_2 are arranged to make signals have efficient tracking ability. The compensators 140_1 and 140_2 can be implemented by using a combination of resistor(s) and capacitor(s) for Miller compensation. Each of the output stage 150_1 and 150_2 may be implemented by a PMOS and an NMOS, and the output stage 150_1 and 150_2 are arranged to generate a differential pair of output signals Vop and Von according to the outputs of the first cascoded circuit 102 and the second cascoded circuit 104.

In the operations of the amplifier 100, the amplifying stage 110 is arranged to receive the differential input pair comprising the differential pair of input signals Vin and Vip to generate amplified input signals to the source electrodes of the NMOSs MN2 and MN4, respectively. Then, the NMOSs MN2 and MN4 generate outputs at the drain electrodes of the NMOSs MN2 and MN4 according to the received amplified input signals, respectively. Meanwhile, the input feed-forward circuit 120 feeds the input signals Vip and Vin to the gate electrodes of the PMOSs MP2 and MP4, respectively, and the PMOSs MP2 and MP4 generate outputs at the drain electrodes of the PMOSs MP2 and MP4 according to the received input signals Vip and Vin, respectively. Then, the output stage 150_1 receives the outputs of the PMOS MP2 and the NMOS MN2 to generate the output signal Vop, and the output stage 150_2 receives the outputs of the PMOS MP4 and the NMOS MN4 to generate the output signal Von. In addition, the class AB control circuit 130_1 and 130_2 are used to make the signals at the drain electrodes of the PMOSs MP2 and MP4 and NMOSs MN2 and MN4 have efficient tracking ability when the output signals Vop and Von vary; and the compensator 140_1 and 140_2 are for miller compensation.

By using the input feed-forward circuit 120, the poles of overall transfer function of the amplifier 100 can be reduced to improve the stability and extend the bandwidth of the amplifier 100. However, using the input feed-forward circuit 120 to feed the input signals Vip and Vin forward to the PMOSs MP2 and MP4 may induce a common mode positive feedback loop, which is an unwanted effect and needs to be eliminated in the amplifier 100. To solve this problem, the source electrodes of the PMOSs MP2 and MP4 are electrically connected to each other to make gains of the PMOSs MP2 and MP4 be very low for the common mode, to improve a common mode rejection ratio and to eliminate the unwanted common mode positive feedback.

Figure 2:
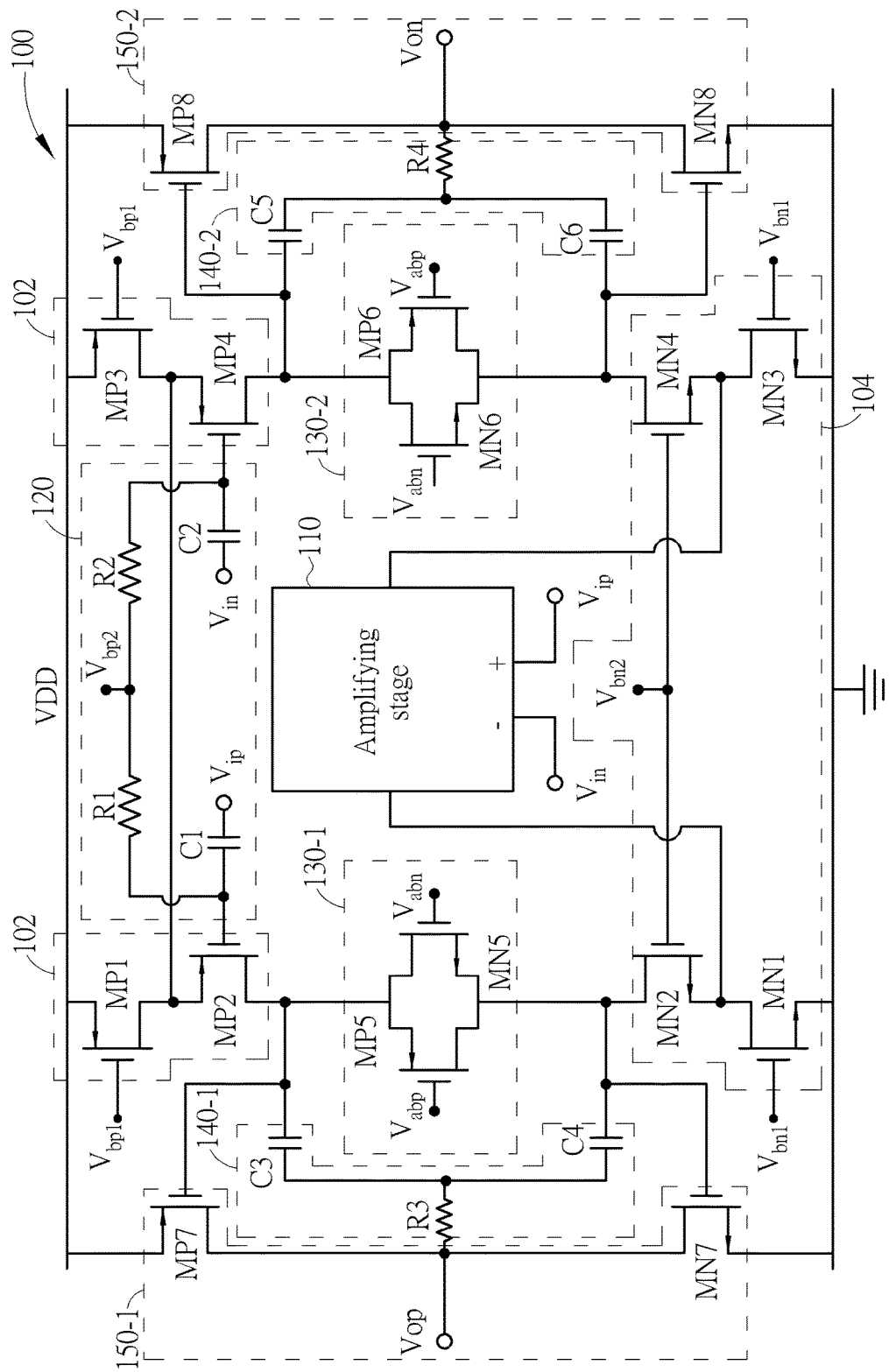
FIG. 2 is a detailed circuit structure of the amplifier shown in FIG. 1 according to one embodiment of the present invention.

FIG. 2 is a detailed circuit structure of the amplifier 100 according to one embodiment of the present invention. As shown in FIG. 2, the input feed-forward circuit 120 comprises two capacitors C1 and C2 and two resistors R1 and R2, the capacitor C1 is coupled between the input signal Vip and the gate electrode of the PMOS MP2, the capacitor C2 is coupled between the input signal Vin and the gate electrode of the PMOS MP4, the resistor R1 is coupled between a bias voltage $V_{bp2}$ and the gate electrode of the PMOS MP2, and the resistor R2 is coupled between the bias voltage $V_{bp2}$ and the gate electrode of the PMOS MP4. The two capacitors C1 and C2 and two resistors R1 and R2 form high-pass filters to make the PMOSs MP2 and MP4 receive the high-pass filtered input signals Vip and Vin, respectively. The class AB control circuit 130_1 comprises a PMOS MP5 and an NMOS MN5, where a source electrode of the PMOS MP5 and a drain electrode of the NMOS MN5 connects to the drain electrode of the PMOS MP2, and a drain electrode of the PMOS MP5, a source electrode of the NMOS MN5 connects to the drain electrode of the NMOS MN2, and the PMOS MP5 and the NMOS MN5 are biased by bias voltages $V_{abp}$ and $V_{abn}$, respectively. The class AB control circuit 130_2 comprises a PMOS MP6 and an NMOS MN6, where a source electrode of the PMOS MP6 and a drain electrode of the NMOS MN6 connects to the drain electrode of the PMOS MP4, and a drain electrode of the PMOS MP6 and a source electrode of the NMOS MN6 connects to the drain electrode of the NMOS MN4, and the PMOS MP6 and the NMOS MN6 are biased by the bias voltages $V_{abp}$ and $V_{abn}$, respectively. The compensator 130_1 comprises two capacitors C3 and C4 and a resistor R3, and the compensator 130_2 comprises two capacitors C5 and C6 and a resistor R4. The output stage 150_1 comprises a PMOS MP7 and an NMOS MN7, where a drain electrode of the PMOS MP7 and a drain electrode of the NMOS MN7 are connected together to serve as one output node. The output stage 150_2 comprises a PMOS MP8 and an NMOS MN8, where a drain electrode of the PMOS MP8 and a drain electrode of the NMOS MN8 are connected together to serve as another output node.

Figure 3:
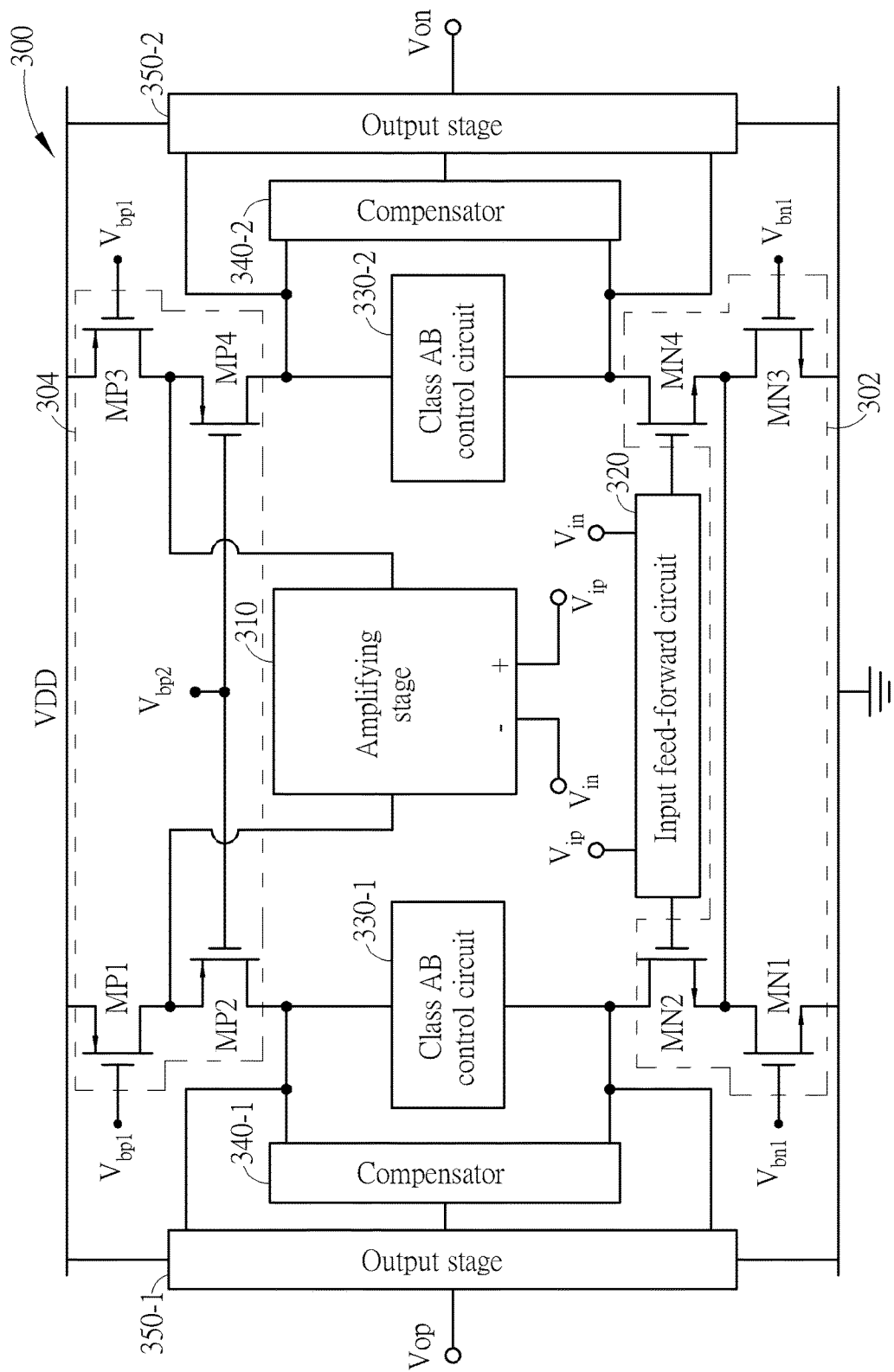
FIG. 3 is a diagram illustrating an amplifier according to another embodiment of the present invention.

Please refer to FIG. 3, which is a diagram illustrating an amplifier 300 according to another embodiment of the present invention, where in this embodiment, the amplifier 300 is a class AB amplifier. As shown in FIG. 3, the amplifier 300 supplied by a supply voltage VDD comprises a first cascoded circuit 302, a second cascoded circuit 304, an amplifying stage 310, an input feed-forward circuit 320, class AB control circuits 330_1 and 330_2, compensators 340_1 and 340_2, and output stages 350_1 and 350_2.

In this embodiment, the first cascoded circuit 302 comprises four NMOSs MN1-MN4, where the NMOSs MN1 and MN2 are connected in cascode, the NMOSs MN3 and MN4 are connected in cascode, each of the NMOSs MN1 and MN3 are biased by a bias voltage $V_{bn1}$ to be a current source, and a source electrode the NMOS MN2 is directly connected to a source electrode of the NMOS MN4; the second cascoded circuit 304 comprises four PMOSs MP1-MP4, where the PMOSs MP1 and MP2 are connected in cascode, the PMOSs MP3 and MP4 are connected in cascode, each of the PMOSs MP1 and MP3 are biased by a bias voltage $V_{bp1}$ to be a current source, and each of the PMOSs MP2 and MP4 are biased by a bias voltage $V_{bp2}$. The amplifying stage 310 can be any suitable differential amplifying stage such as a cascode differential amplifier. The input feed-forward circuit 320 is coupled to gate electrodes of the NMOSs MN2 and MN4, and the input feed-forward circuit 320 is arranged to feed the differential pair of input signals Vip and Vin forward to the NMOSs MN2 and MN4, respectively. The class AB control circuit 330_1 is coupled between the PMOS MP2 and the NMOS MN2, the class AB control circuit 330_2 is coupled between the PMOS MP4 and the NMOS MN4, and the class AB control circuits 330_1 and 330_2 are arranged to make signals have efficient tracking ability. The compensators 340_1 and 340_2 can be implemented by using a combination of resistor(s) and capacitor(s) for Miller compensation. Each of the output stage 350_1 and 350_2 may be implemented by using a PMOS and an NMOS, and the output stage 350_1 and 350_2 are arranged to generate a differential pair of output signals Vop and Von according to the outputs of the first cascoded circuit 302 and the second cascoded circuit 304.

In the operations of the amplifier 300, the amplifying stage 310 is arranged to receive the differential input pair comprising the differential pair of input signals Vin and Vip to generate amplified input signals to the source electrodes of the PMOSs MP2 and MP4, respectively. Then, the PMOSs MP2 and MP4 generate outputs at the drain electrodes of the PMOSs MP2 and MP4 according to the received amplified input signals, respectively. Meanwhile, the input feed-forward circuit 320 feeds the input signals Vip and Vin to the gate electrodes of the NMOSs MN2 and MN4, respectively, and the NMOSs MN2 and MN4 generate outputs at the drain electrodes of the NMOSs MN2 and MN4 according to the received input signals Vip and Vin, respectively. Then, the output stage 350_1 receives the outputs of the PMOS MP2 and the NMOS MN2 to generate the output signal Vop, and the output stage 350_2 receives the outputs of the PMOS MP4 and the NMOS MN4 to generate the output signal Von. In addition, the class AB control circuit 330_1 and 330_2 are used to make the signals at the drain electrodes of the PMOSs MP2 and MP4 and NMOSs MN2 and MN4 have efficient tracking ability when the output signals Vop and Von vary; and the compensator 340_1 and 340_2 are for Miller compensation.

By using the input feed-forward circuit 320, the poles of overall transfer function of the amplifier 300 can be reduced to improve the stability and extend the bandwidth of the amplifier 300. However, using the input feed-forward circuit 320 to feed the input signals Vip and Vin forward to the NMOSs MN2 and MN4 may induce a common mode positive feedback loop, which is an unwanted effect and needs to be eliminated in the amplifier 300. To solve this problem, the source electrodes of the NMOSs MN2 and MN4 are electrically connected to each other to make gains of the NMOSs MN2 and MN4 low for the common mode, to improve a common mode rejection ratio and to avoid the common mode positive feedback issue.

Figure 4:
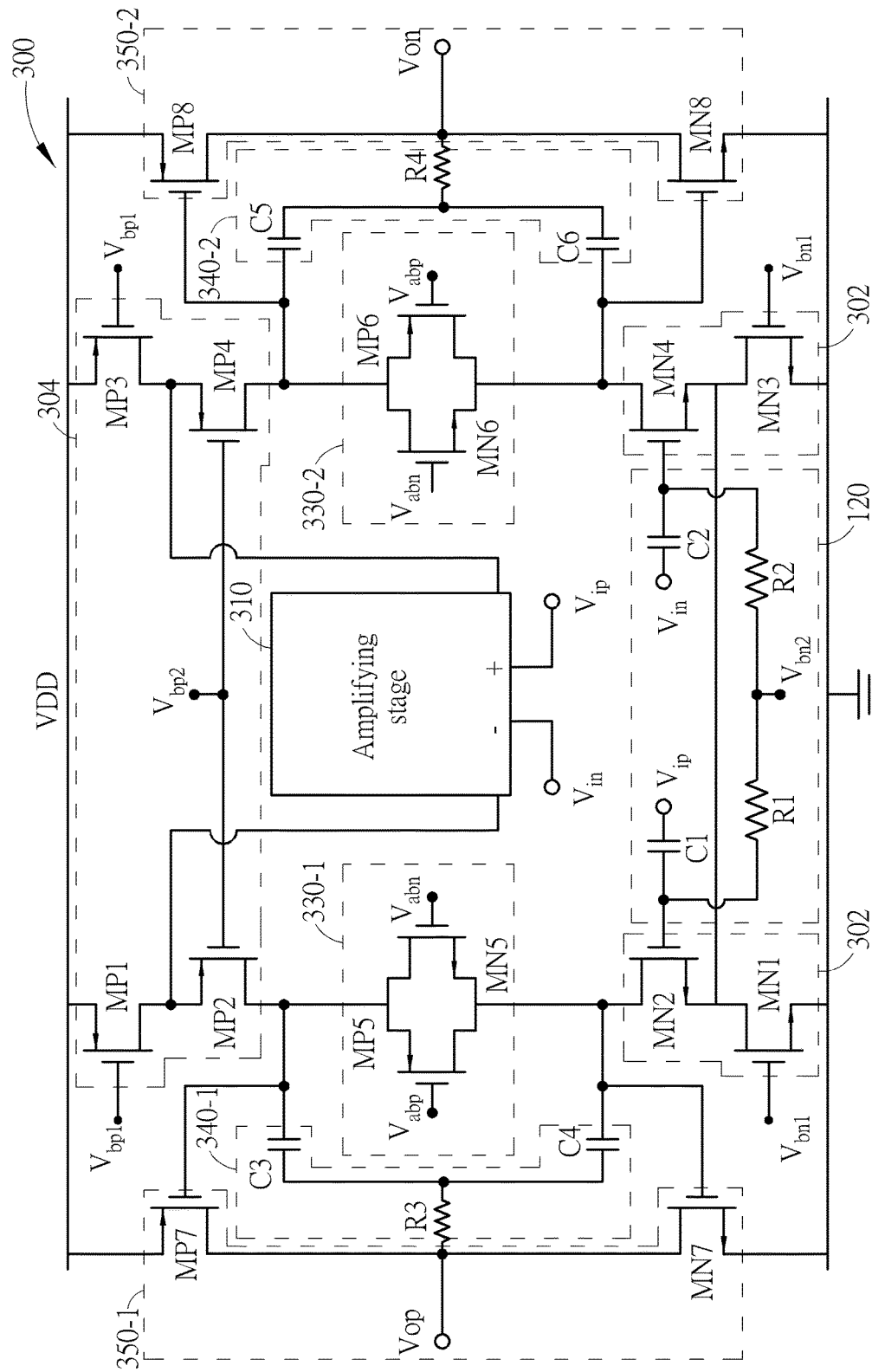
FIG. 4 is a detailed circuit structure of the amplifier shown in FIG. 3 according to one embodiment of the present invention.

FIG. 4 is a detailed circuit structure of the amplifier 300 according to one embodiment of the present invention. As shown in FIG. 4, the input feed-forward circuit 320 comprises two capacitors C1 and C2 and two resistors R1 and R2, the capacitor C1 is coupled between the input signal Vip and the gate electrode of the NMOS MN2, the capacitor C2 is coupled between the input signal Vin and the gate electrode of the NMOS MN4, the resistor R1 is coupled between a bias voltage $V_{bn2}$ and the gate electrode of the NMOS MN2, and the resistor R2 is coupled between the bias voltage $V_{bn2}$ and the gate electrode of the NMOS MN4. The two capacitors C1 and C2 and two resistors R1 and R2 form high-pass filters to make the NMOSs MN2 and MN4 receive the high-pass filtered input signals Vip and Vin, respectively. The class AB control circuit 330_1 comprises a PMOS MP5 and an NMOS MN5, where a source electrode of the PMOS MP5 and a drain electrode of the NMOS MN5 connects to the drain electrode of the PMOS MP2, and a drain electrode of the PMOS MP5, a source electrode of the NMOS MN5 connects to the drain electrode of the NMOS MN2, and the PMOS MP5 and the NMOS MN5 are biased by bias voltages $V_{abp}$ and $V_{abn}$, respectively. The class AB control circuit 330_2 comprises a PMOS MP6 and an NMOS MN6, where a source electrode of the PMOS MP6 and a drain electrode of the NMOS MN6 connects to the drain electrode of the PMOS MP4, and a drain electrode of the PMOS MP6 and a source electrode of the NMOS MN6 connects to the drain electrode of the NMOS MN4, and the PMOS MP6 and the NMOS MN6 are biased by the bias voltages $V_{abp}$ and $V_{abn}$, respectively. The compensator 330_1 comprises two capacitors C3 and C4 and a resistor R3, and the compensator 330_2 comprises two capacitors C5 and C6 and a resistor R4. The output stage 350_1 comprises a PMOS MP7 and an NMOS MN7, where a drain electrode of the PMOS MP7 and a drain electrode of the NMOS MN7 are connected together to serve as one output node. The output stage 350_2 comprises a PMOS MP8 and an NMOS MN8, where a drain electrode of the PMOS MP8 and a drain electrode of the NMOS MN8 are connected together to serve as another output node.

Briefly summarized, in the embodiment of the class AB amplifier of the present invention, a feed-forward circuit is used to feed the differential input pair to the cascoded circuit to reduce the poles of the overall transfer function of the amplifier, to improve the stability and extend the bandwidth of the amplifier. In addition, by further using a short circuit connected between two cascoded transistors, a common mode rejection ratio is improved and a common mode positive feedback can be avoided. Therefore, the differential stability of the amplifier can be improved without sacrificing common mode stability.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. An amplifier, comprising:
 an amplifying stage, for receiving a differential input pair to generate an amplified differential input pair;
 a first cascoded circuit;
 an input feed-forward circuit, coupled to the first cascoded circuit, for feeding the differential input pair forward to the first cascoded circuit; and
 an output stage, coupled to the amplifying stage and the first cascoded circuit, for generating a differential output pair according to the amplified differential input pair and an output of the first cascoded circuit.

2. The amplifier of claim 1, wherein the differential input pair comprises a first input signal and a second input signal, the first cascoded circuit comprises a first transistor and a second transistor connected in cascode and a third transistor and a fourth transistor connected in cascode, the first transistor and the third transistor serve as current sources, and the input feed-forward circuit feeds the first input signal and the second input signal to the second transistor and the fourth transistor, respectively.

3. The amplifier of claim 2, wherein the input feed-forward circuit feeds the first input signal and the second input signal to the second transistor and the fourth transistor via high pass filters, respectively.

4. The amplifier of claim 3, wherein the input feed-forward circuit comprises:
 a first capacitor, coupled between the first input signal and a gate electrode of the second transistor;
 a second capacitor, coupled between the second input signal and a gate electrode of the fourth transistor;
 a first resistor, coupled between a bias voltage and the gate electrode of the second transistor; and
 a second resistor, coupled between the bias voltage and the gate electrode of the fourth transistor.

5. The amplifier of claim 2, wherein each of the first transistor, the second transistor, the third transistor and the fourth transistor is a PMOS.

6. The amplifier of claim 5, wherein a source electrode of the second transistor is electrically connected to a source electrode of the fourth transistor.

7. The amplifier of claim 2, wherein each of the first transistor, the second transistor, the third transistor and the fourth transistor is an NMOS.

8. The amplifier of claim 7, wherein a source electrode of the second transistor is electrically connected to a source electrode of the fourth transistor.

9. The amplifier of claim 1, further comprising:
 a second cascoded circuit, coupled to the amplifying stage, for receiving the amplified differential input pair;
 wherein the output stage generates the differential output pair according to the output of the first cascoded circuit and an output of the second cascoded circuit.

10. The amplifier of claim 9, wherein the differential input pair comprises a first input signal and a second input signal, and the amplified differential input pair comprises a first amplified input signal and a second amplified input signal; and the first cascoded circuit comprises a first PMOS and a second PMOS connected in cascode and a third PMOS and a fourth PMOS connected in cascode, the first PMOS and the third PMOS serve as current sources, and the input feed-forward circuit feeds the first input signal and the second input signal to the second PMOS and the fourth PMOS, respectively; and the second cascoded circuit comprises a first NMOS and a second NMOS connected in cascode and a third NMOS and a fourth NMOS connected in cascode, the first NMOS and the third NMOS serve as current sources, and the source electrodes of the second NMOS and the fourth NMOS receive the first amplified input signal and the second amplified input signal, respectively.

11. The amplifier of claim 10, wherein the input feed-forward circuit feeds the first input signal and the second input signal to the second PMOS and the fourth PMOS via high pass filters, respectively.

12. The amplifier of claim 10, wherein a source electrode of the second PMOS is electrically connected to a source electrode of the fourth PMOS.

13. The amplifier of claim 9, wherein the differential input pair comprises a first input signal and a second input signal, and the amplified differential input pair comprises a first amplified input signal and a second amplified input signal; and the first cascoded circuit comprises a first NMOS and a second NMOS connected in cascode and a third NMOS and a fourth NMOS connected in cascode, the first NMOS and the third NMOS serve as current sources, and the input feed-forward circuit feeds the first input signal and the second input signal to the second NMOS and the fourth NMOS, respectively; and the second cascoded circuit comprises a first PMOS and a second PMOS connected in cascode and a third PMOS and a fourth PMOS connected in cascode, the first PMOS and the third PMOS serve as current sources, and the source electrodes of the second PMOS and the fourth PMOS receive the first amplified input signal and the second amplified input signal, respectively.

14. The amplifier of claim 13, wherein the input feed-forward circuit feeds the first input signal and the second input signal to the second NMOS and the fourth NMOS via high pass filters, respectively.

15. The amplifier of claim 13, wherein a source electrode of the second NMOS is electrically connected to a source electrode of the fourth NMOS.

16. The amplifier of claim 9, further comprising:
a class AB control circuit coupled between the first cascoded circuit and the second cascoded circuit.

17. A class AB amplifier, comprising:
an amplifying stage, for receiving a differential input pair to generate an amplified differential input pair;
a first cascoded circuit;
an input feed-forward circuit, coupled to the first cascoded circuit, for feeding the differential input pair forward to the first cascoded circuit; and
an output stage, coupled to the amplifying stage and the first cascoded circuit, for generating a differential output pair according to the amplified differential input pair and an output of the first cascoded circuit.

18. The amplifier of claim 17, wherein the differential input pair comprises a first input signal and a second input signal, the first cascoded circuit comprises a first transistor and a second transistor connected in cascode and a third transistor and a fourth transistor connected in cascode, the first transistor and the third transistor serve as current sources, and the input feed-forward circuit feeds the first input signal and the second input signal to the second transistor and the fourth transistor, respectively.

19. The amplifier of claim 18, wherein the input feed-forward circuit feeds the first input signal and the second input signal to the second transistor and the fourth transistor via high pass filters, respectively.

20. The amplifier of claim 18, wherein the first transistor and the second transistor are connected in cascode via a first node, the third transistor and the fourth transistor are connected in cascode via a second node, and the first node is electrically connected to the second node.

* * * * *